United States Patent [19]

Brainard et al.

[11] 4,336,117
[45] Jun. 22, 1982

[54] REFRACTORY COATINGS AND METHOD OF PRODUCING THE SAME

[75] Inventors: William A. Brainard, Arlington, Va.; Donald R. Wheeler, Bay Village, Ohio

[73] Assignee: The United States of America as represented by the Administrator of the National Aeronautics and Space Administration, Washington, D.C.

[21] Appl. No.: 102,003

[22] Filed: Dec. 7, 1979

[51] Int. Cl.³ .............................................. C23C 15/00
[52] U.S. Cl. .................................................. 204/192 C
[58] Field of Search ........................ 204/192 C, 192 SP

[56] References Cited

U.S. PATENT DOCUMENTS

| | | | |
|---|---|---|---|
| 3,503,787 | 3/1970 | Penose | 117/93.1 |
| 3,793,175 | 2/1974 | Joly | 204/192 C |
| 3,798,145 | 3/1974 | Fournier | 204/192 C |
| 3,912,461 | 10/1975 | Wakefield | 204/192 |
| 4,098,956 | 7/1978 | Blickensderfer | 428/627 |

FOREIGN PATENT DOCUMENTS 1117009  6/1968  United Kingdom .......... 204/192 SP

OTHER PUBLICATIONS

Stephen Pepper et al., Shear Strength of Metal-SiO₂ Contacts, NASA TM-78838, 3/78.
J. E. Greene and M. Pestes, Adhesion of Sputter-Deposited Carbide Films to Steel Substrates, *Thin Solid Films*, 37 (1976), pp. 373-385.
William A. Brainard et al., "An XPS Study of the Adherence of Refractory . . . Coatings", J. Vac. Sci. Technol. 15(6), Nov./Dec. 1978, pp. 1800-1805.

*Primary Examiner*—Delbert E. Gantz
*Assistant Examiner*—William Leader
*Attorney, Agent, or Firm*—Norman T. Musial; John R. Manning; Gene E. Shook

[57] ABSTRACT

This invention is concerned with improving adhesion, friction and wear properties of sputtered refractory coatings on substrates of materials that form stable nitrides.

Each substrate (10) is placed directly below a titanium carbide target (16) of a commercial radiofrequency diode apparatus (14) in a vacuum chamber (26). Nitrogen is bled into the system through a nozzle (30) resulting in a small partial pressure of about 0.5% to 2.5% during the first two minutes of deposition. The flow of nitrogen is then stopped, and the sputtering ambient is reduced to pure argon through a nozzle (28) without interrupting the sputtering process.

When nitrogen is deliberately introduced during the crucial interface formation, some of the titanium at the interface reacts to form titanium nitride while the metal of the substrate also forms the nitride. These two nitrides atomically mixed together in the interfacial region (38) act to more strongly bond the growing titanium carbide coating (12) as it forms on the substrate (10).

5 Claims, 2 Drawing Figures

REFRACTORY COATINGS AND METHOD OF PRODUCING THE SAME

DESCRIPTION

ORIGIN OF THE INVENTION

The invention described herein as made by employees of the United States Government and may be manufactured and used by or for the Government for governmental purposes without the payment of any royalties thereon or therefor.

TECHNICAL FIELD

This invention is concerned with improving the properties of sputtered refractory coatings on a substrate of a material that forms stable nitrides. Adhesion, friction, and wear properties of refractory coatings produced in accordance with the invention are superior to similar properties of conventional coatings.

Various hard coatings that are applied by rf sputtering have been proposed for improving wear resistance and providing low friction characteristics. It is the adherence of these coatings to the substrate rather than other coating properties that is the limiting factor in their use. Failures are generally observed to occur at the coating-substrate interface.

Titanium carbide coatings are used in anti-wear applications. Such coatings are used to prevent fretting fatigue and wear in titanium alloy aircraft parts. Titanium carbide has been proposed for cutting tool coatings as well as for bearing and seal applications.

BACKGROUND ART

U.S. Pat. No. 4,098,956 to Blickensdorfer et al discloses a process for making spectrally selective solar absorbers by depositing layers of metal or carbides, including titanium, wherein oxides, suboxides, or nitrides can be produced using the appropriate atmosphere of oxygen or nitrogen with argon during sputtering. In one embodiment a subnitride of the metal is produced. Pendse U.S. Pat. No. 3,503,787 is concerned with making refractory aluminum nitride coatings by plasma spraying. Titanium nitride is formed by the use of nitrogen in the plasma. Wakefield U.S. Pat. No. 3,912,461 is directed to the sputtering of titanium carbonate onto a substrate to produce a hard, wear-resistant surface. None of these patents is concerned with providing metal nitrides in the interfacial region between a substrate and refractory coating.

DISCLOSURE OF INVENTION

In accordance with the present invention a thin sputtered film is provided that exhibits improved adherence to a substrate and has improved friction and wear characteristics. These improvements are achieved by coating the substrate by rf sputtering with a film of titanium carbide using an argon sputtering plasma. A small nitrogen partial pressure from about 0.5% to 2.5% is added in the initial stages of the deposition during which the interface is formed. The improvements in adhesion of the titanium carbide coating to the substrate results from the presence of both titanium nitride and a nitride of the substrate in the interfacial region.

BRIEF DESCRIPTION OF DRAWINGS

The details of the invention will be described in connection with the accompanying drawings wherein.

DETAILED DESCRIPTION OF THE INVENTION

Figure 1:
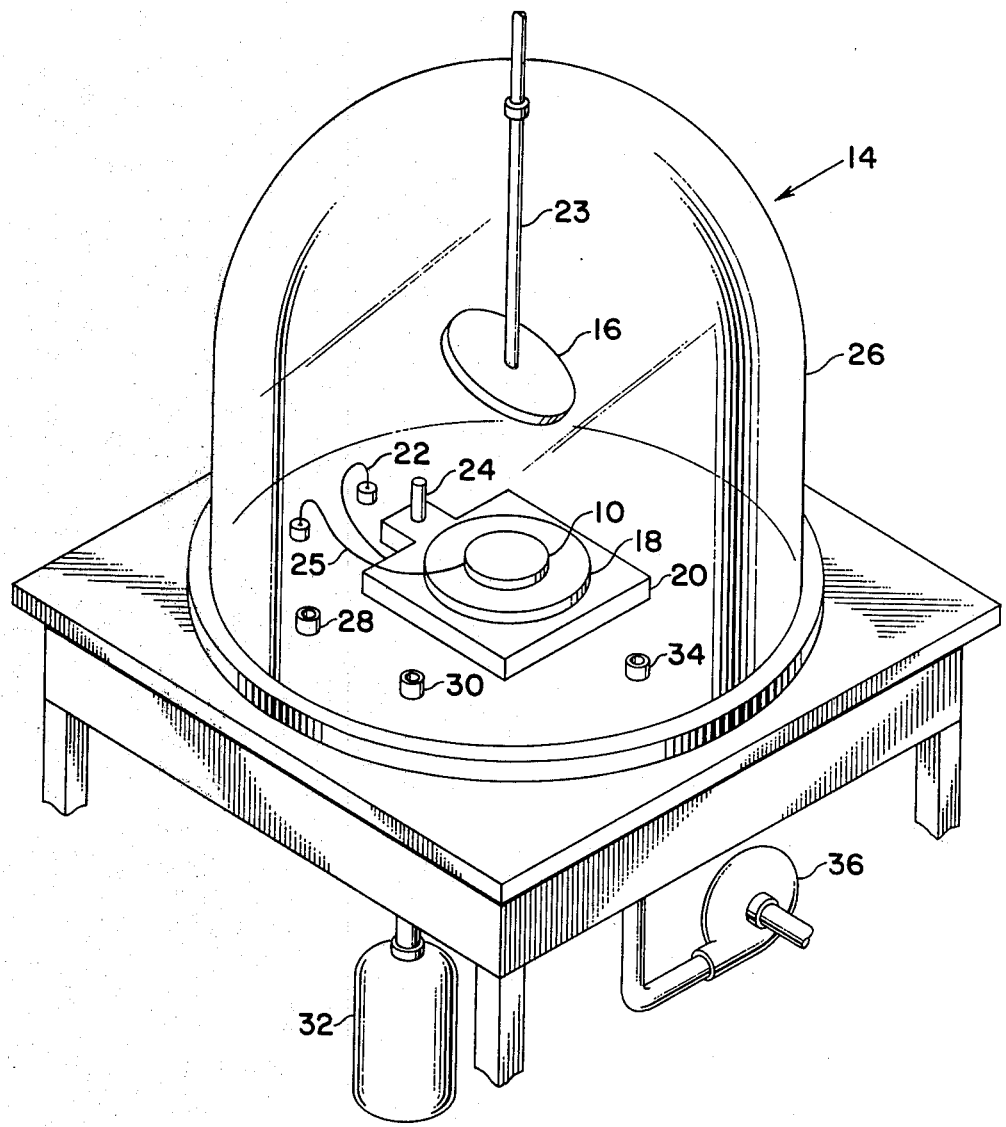
FIG. 1 is a perspective view of an apparatus utilized in sputtering a refractory coating onto a substrate.
Figure 2:
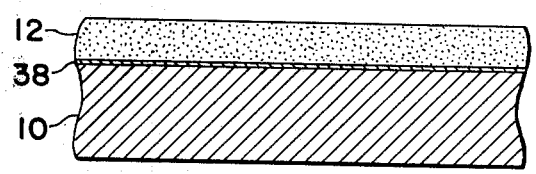
FIG. 2 is an enlarged sectional view of a substrate coated in accordance with the present invention.

Referring now to the drawings there is shown in FIG. 2 a substrate 10 coated with a refractory film 12. The substrate 10 is of a material that forms stable nitrides and is preferably a metal.

Test specimen substrates 10 in the form of 440-C bearing-steel discs were coated in accordance with the invention. All of the disc specimens were mechanically polished in the same manner. The discs were abraded on silicon carbide paper down to 600 grit. Then they were polished with three $\mu m$ diamond paste and lapped with one $\mu m$ alumina. After lapping the discs were rinsed with alcohol and dried. The metal disc substrates were then individually mounted in a commercial radiofrequency diode apparatus 14 in a manner described below for coating in accordance with the invention. This apparatus operated at 13.56 MHz.

Each polished disc substrate 10 to be coated is placed directly below a titanium carbide target 16 on an electrically insulated block 18. A substrate table 20 that is grounded by a conductor 22 supports the block 18.

Each disc substrate 10 is positioned in this manner approximately 2.5 centimeters directly below the target 16. The grounded table 20 and the target 16 constitute the rf diode. The rf voltage and target cooling are supplied through a support 23. An additional voltage from zero to $-1500$ v dc may be applied directly to the disc 10 through a conductor 25 either for cleaning by direct-current sputter etching or for biasing during film deposition and growth.

Provision is made for the entire substrate table 20 to be rotated selectively about a support post 24. By rotating the table 20 the target 16 can be cleaned without contaminating the disc specimen 10. Cleaning the disc specimen 10 is accomplished by sputter etching at $-1200$ v for 15 minutes after the target cleaning is completed. The cleaning and coating operations are performed in a vacuum chamber 26 which houses the target 16 as well as the grounded table 20.

A regulated flow of high purity argon is selectively introduced into the vacuum chamber 26 through a nozzle 28. A second nozzle 30 admits a controlled flow of nitrogen from a supply cylinder 32. The flow of nitrogen is controlled by variable leak valves.

After cleaning, the flow of argon through the nozzle 28 is interrupted and the chamber is pumped by a vacuum line 34 connected to a vacuum pump 36. The system is pumped down to a base pressure of about $10^{-6}$ torr.

According to the invention, nitrogen is then bled into the system through the nozzle 30 from the cylinder 32 at a pressure in the range of about $1.3 \times 10^{-2}$ to $6.6 \times 10^{-2}$ Newtons per square meter. Once the desired pressure is reached, argon is again admitted through the nozzle 28, and the total pressure is raised to the sputtering pressure of approximately 20 $\mu m$.

The voltage on the disc specimen is reduced to $-500$ v for biasing in a manner well known in the art. The disc specimen 10 is rotated by the table 20 back under the target 16, and deposition is begun.

According to the present invention the critical interfacial region 38 is formed during the first two minutes of deposition. After this first two minutes, the flow of nitrogen through the nozzle 30 is stopped, and the sputtering ambient is again reduced to pure argon without interrupting the sputtering process. The balance of the deposition is then completed.

The power density is about 1.64 Wcm$^{-2}$. Coatings are approximately 2000 angstroms in thickness for friction and wear testing. These thicknesses were measured by surface profilometry of a deposition step.

When nitrogen is deliberately introduced during the crucial interface formation, some of the titanium of the interface reacts to form titanium nitride while iron in the substrate 10 forms a nitride. These two nitrides, atomically mixed together in the interfacial region 38 shown in FIG. 2, act to more strongly bond the growing titanium carbide coating.

A number of test specimens were coated in accordance with the invention with various nitrogen partial pressures in the range of $6.6 \times 10^{-1}$ to $6.6 \times 10^{-3}$ Newtons per square meter. The coatings were evaluated in a pin-on-disc apparatus of the type used for solid film lubrication evaluation. This test apparatus has a stainless steel pin selectively loaded against each test specimen as the disc is rotated. A strain gauge is used to measure the friction force.

Each disc specimen was tested for 30 minutes in a dry nitrogen atmosphere at a constant speed. The results are shown in the table.

| Nitrogen partial pressure (N m$^2$) | Percent of Plasma | Friction and wear behavior at 10 N load |
|---|---|---|
| $6.6 \times 10^{-3}$ | 0.25 | Film failure |
| $1.3 \times 10^{-2}$ | 0.50 | Smooth low friction, $\mu = 0.35$ |
| $6.6 \times 10^{-2}$ | 2.5 | Smooth low friction, $\mu = 0.35$ |
| $1.3 \times 10^{-1}$ | 5 | Film failure |
| $6.6 \times 10^{-1}$ | 25 | Film failure |

Although the invention has been described relative to exemplary embodiments thereof, it will be understood that other variations and modifications can be effected in these embodiments without departing from the scope and spirit of the invention.

We claim:

1. In a method of producing a hard coated article of manufacture wherein a titanium carbide coating is deposited on a steel substrate from a radiofrequency sputtering plasma, the improvement comprising
   introducing nitrogen into the sputtering environment during the formation of the interfacial region of the coating at the substrate thereby forming a mixture of titanium nitrides and iron nitrides in said interfacial region which improves the bond between the coating and the substrate.

2. The method of claim 1 wherein nitrogen is introduced at a partial pressure sufficient to comprise about 0.5% to 2.5% of the plasma.

3. The method of claim 2 wherein the nitrogen is introduced for about two minutes.

4. A method of producing a hard coated article of manufacture having improved adhesion between a titanium carbide refractory coating and a steel substrate comprising the steps of
   placing the substrate in a vacuum chamber containing radiofrequency diode apparatus,
   reducing the pressure in said chamber to a base pressure of about $10^{-6}$ torr,
   supplying nitrogen to said vacuum chamber at a pressure in the range of about $1.3 \times 10^{-2}$ to about $6.6 \times 10^{-2}$ Newtons per square meter,
   admitting argon into said vacuum chamber to raise the total pressure to about 20 $\mu$m,
   sputtering to deposit from a plasma an interfacial region which contains a mixture of titanium nitride and iron nitride,
   interrupting the supply of nitrogen to said vacuum chamber, and
   sputtering to deposit the remainder of the titanium carbide refractory coating in an environment substantially free of nitrogen so that said remainder of the titanium carbide refractory coating is substantially free of titanium nitride and iron nitride.

5. A method of producing a hard coated article of manufacture as claimed in claim 4 wherein the supply of nitrogen to the vacuum chamber is interrupted about two minutes after the radiofrequency sputtering is started.

* * * * *